(12) United States Patent
Yang

(10) Patent No.: US 11,688,801 B2
(45) Date of Patent: Jun. 27, 2023

(54) HEMT AND METHOD OF FABRICATING THE SAME

(71) Applicant: UNITED MICROELECTRONICS CORP., Hsin-Chu (TW)

(72) Inventor: Po-Yu Yang, Hsinchu (TW)

(73) Assignee: UNITED MICROELECTRONICS CORP., Hsin-Chu (TW)

( * ) Notice: Subject to any disclaimer, the term of this patent is extended or adjusted under 35 U.S.C. 154(b) by 210 days.

(21) Appl. No.: 17/152,742

(22) Filed: Jan. 19, 2021

(65) Prior Publication Data

US 2022/0190149 A1 Jun. 16, 2022

(30) Foreign Application Priority Data

Dec. 11, 2020 (CN) .......................... 202011457077.3

(51) Int. Cl.
| | |
|---|---|
| *H01L 29/778* | (2006.01) |
| *H01L 29/66* | (2006.01) |
| *H01L 29/423* | (2006.01) |
| *H01L 29/20* | (2006.01) |
| *H01L 29/205* | (2006.01) |

(52) U.S. Cl.
CPC ...... *H01L 29/7786* (2013.01); *H01L 29/2003* (2013.01); *H01L 29/205* (2013.01); *H01L 29/4232* (2013.01); *H01L 29/66462* (2013.01)

(58) Field of Classification Search
CPC ..... H01L 29/402–407; H01L 29/66431; H01L 29/66462; H01L 29/778–7789
See application file for complete search history.

(56) References Cited

U.S. PATENT DOCUMENTS

| | | | |
|---|---|---|---|
| 2005/0110042 A1* | 5/2005 | Saito ................... | H01L 29/417 257/E29.119 |
| 2005/0189559 A1* | 9/2005 | Saito ................... | H01L 29/432 257/E29.252 |
| 2013/0082277 A1* | 4/2013 | Park ................... | H01L 29/7787 257/E29.089 |
| 2013/0240951 A1 | 9/2013 | Bedell | |
| 2018/0033631 A1 | 2/2018 | Bera | |
| 2021/0167202 A1* | 6/2021 | Lu ........................ | H01L 29/2003 |
| 2022/0005944 A1* | 1/2022 | Chou .................. | H01L 29/1066 |
| 2022/0165875 A1* | 5/2022 | Otake ............... | H01L 29/66462 |

FOREIGN PATENT DOCUMENTS

CN  105097911  11/2017

* cited by examiner

*Primary Examiner* — Eric A. Ward
(74) *Attorney, Agent, or Firm* — Winston Hsu

(57) ABSTRACT

An HEMT includes a first III-V compound layer. A second III-V compound layer is disposed on the first III-V compound layer. The composition of the first III-V compound layer is different from the composition of the second III-V compound layer. A third III-V compound layer is disposed on the second III-V compound layer. The first III-V compound layer and the third III-V compound layer are composed of the same group III-V elements. The third III-V compound layer includes a body and numerous finger parts. Each of the finger parts is connected to the body. All finger parts are parallel to each other and do not contact each other. A source electrode, a drain electrode and a gate electrode are disposed on the first III-V compound layer.

19 Claims, 8 Drawing Sheets

HEMT AND METHOD OF FABRICATING THE SAME

BACKGROUND OF THE INVENTION

1. Field of the Invention

The present invention relates to a high electron mobility transistor (HEMT) and a fabricating method of the HEMT and more particularly to an HEMT with finger parts extending from the gate and method of fabricating the same.

2. Description of the Prior Art

Due to their semiconductor characteristics, III-V semiconductor compounds may be applied in many kinds of integrated circuit devices, such as high power field effect transistors, high frequency transistors, or high electron mobility transistors (HEMTs). In the high electron mobility transistor, two semiconductor materials with different bandgaps are combined and a heterojunction is formed at the junction between the semiconductor materials as a channel for carriers. In recent years, gallium nitride (GaN) based materials have been applied in high power and high frequency products because of their properties of wider bandgap and high saturation velocity.

A two-dimensional electron gas (2DEG) may be generated by the piezoelectric property of the GaN-based materials, and the switching velocity may be enhanced because of the higher electron velocity and the higher electron density of the 2DEG.

Regarding punch-through voltage of HEMTs, the punch-through of HEMTs mainly occurs under the sidewall of the gate which is close to the drain. Therefore, in order to improve the operating efficiency of HEMTs, punch-through voltage has to be increased.

SUMMARY OF THE INVENTION

In light of the above, the present invention provides an HEMT with a gate having finger parts to increase the punch-through voltage of the HEMT.

According to a preferred embodiment of the present invention, an HEMT includes a first III-V compound layer and a second III-V compound layer disposed on the first III-V compound layer, wherein a composition of the first III-V compound layer is different from a composition of the second III-V compound layer. A third III-V compound layer is disposed on the second III-V compound layer, wherein the third III-V compound layer includes a body and a plurality finger parts, each of the finger parts is connected to the body, all finger parts are parallel to each other and do not contact each other. A source electrode is disposed at one side of the body and contacts the first III-V compound layer. A drain electrode is disposed at another side of the body and contacts the first III-V compound layer. A gate electrode is disposed directly on the body.

According to another preferred embodiment of the present invention, a fabricating method of an HEMT includes forming a first III-V compound layer and a second III-V compound layer, wherein the second III-V compound layer is disposed on the first III-V compound layer, and a composition of the first III-V compound layer is different from a composition of the second III-V compound layer. Next, a third III-V compound layer is formed to be disposed on the second III-V compound layer, wherein the third III-V compound layer includes a body and numerous finger parts, each of the finger parts is connected to the body, all finger parts are parallel to each other and do not contact each other. Finally, a source electrode, a drain electrode and a gate electrode are formed, wherein the source electrode is disposed at one side of the body, the drain electrode is disposed at another side of the body and the gate electrode is disposed directly on the body.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
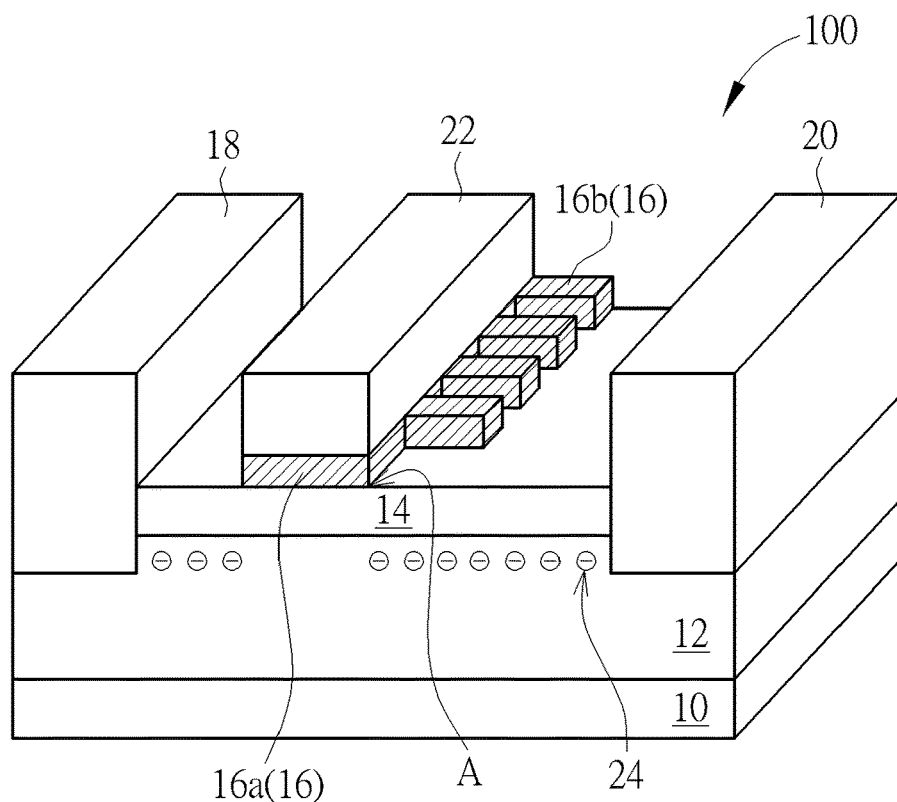
FIG. 1 depicts a three-dimensional view of an HEMT according to a first preferred embodiment of the present invention.
Figure 2:
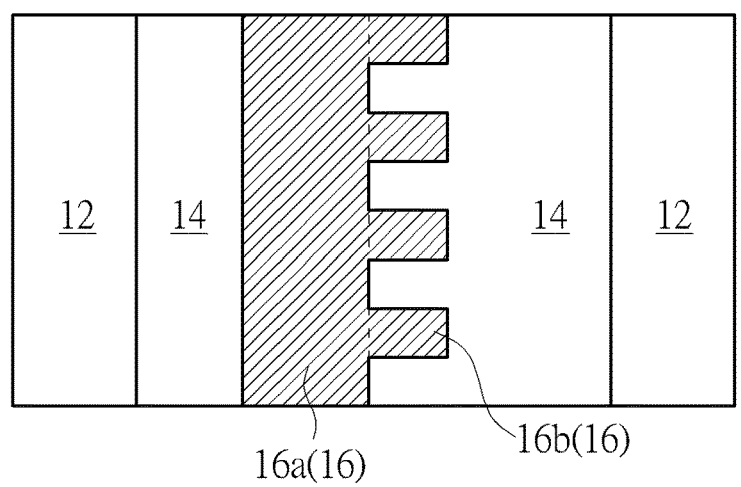
FIG. 2 depicts a top view of an HEMT according to a first preferred embodiment of the present invention.

FIG. 1 depicts a three-dimensional view of an HEMT according to a first preferred embodiment of the present invention. FIG. 2 depicts a top view of an HEMT according to a first preferred embodiment of the present invention, wherein in order to show a third III-V compound layer clearly, a source electrode, a drain electrode and a gate electrode are omitted.

Please refer to FIG. 1 and FIG. 2. An HEMT 100 includes a substrate 10. A first III-V compound layer 12 is disposed on the substrate 10. A second III-V compound layer 14 is disposed on the first III-V compound layer 12. The composition of the first III-V compound layer 12 is different from the composition of the second III-V compound layer 14. A third III-V compound layer 16 is disposed on the second III-V compound layer 14. The first III-V compound layer 12 and the third III-V compound layer 16 can be composed of the same group III-V elements or be composed of different group III-V elements. The third III-V compound layer 16 includes a body 16a and numerous finger parts 16b. Each of the finger parts 16b is connected to the body 16a. All finger parts 16b are parallel to each other and do not contact each other. Dotted lines are applied in FIG. 2 to define the positions of the body 16a and the finger parts 16b, however, the dotted lines are not really on the elements. A source electrode 18 is disposed at one side of the body 16a and contacts the first III-V compound layer 12. A drain electrode 20 is disposed at another side of the body 16a and contacts the first III-V compound layer 12. A gate electrode 22 is disposed directly on the body 16a. The body 16a serves as a gate of the HEMT 100.

According to a preferred embodiment of the present invention, the first III-V compound layer 12 and the third III-V compound layer 16 can be gallium nitride or aluminum gallium nitride. But the first III-V compound layer 12 is an undoped III-V compound layer, and the third III-V compound layer 16 is a P-type III-V compound layer. For example, the first III-V compound layer 12 can be an undoped gallium nitride. The third III-V compound layer 16 can be P-type gallium nitride. Moreover, there are no N-type dopants within the third III-V compound layer 16. That is, there are no N-type dopants within the body 16a and finger parts 16b. The second III-V compound layer 14 includes aluminum gallium nitride, aluminum indium nitride, aluminum indium gallium nitride or aluminum indium. In this embodiment, the second III-V compound layer 14 is undoped aluminum gallium nitride. The source electrode 18, the drain electrode 20 and the gate electrode 22 can respectively include Au, W, Co, Ni, Ti, Mo, Cu, Al, Ta, Pd, Pt or a chemical composition, a composite layer or an alloy including a combination of aforesaid materials. The substrate 10 includes silicon substrate, a germanium substrate, a gallium arsenide substrate, a silicon germanium substrate, a indium phosphide substrate, a gallium nitride substrate, a silicon carbide substrate or a silicon on insulator substrate. The HEMT 100 is a normally off transistor. When the HEMT 100 is turned on, 2DEG 24 is formed in the interface between the first III-V compound layer 12 and the second III-V compound layer 14.

Moreover, the finger parts 16b of the third III-V compound layer 16 are disposed between the body 16a and the drain electrode 20. The finger parts 16b extend along a direction which moves away from the body 16a. In this way, the third III-V compound layer 16 forms a comb profile. Although in the first preferred embodiment, the number of the finger parts are 4, however, the number of the finger parts 16b can be adjusted based on different product requirements. It is noteworthy that the electric field of the interface between the first III-V compound layer 12 and the second III-V compound layer 14 covered by the finger parts 16b becomes uniform. The uniform electric field can increase the withstand voltage of the HEMT 100. That is, the punch-through voltage of the HEMT 100 is increased. On the other hand, if the third III-V compound layer 16 does not include the finger parts 16b, and only includes the body 16a, large electric field will accumulate below the corner of the body 16a. More specifically speaking, a large amount of electrons will accumulate at the corner A of the body 16a which is close to the drain electrode 20. Under this circumstance, current leakage is occurred easily, and the punch-through voltage of the HEMT 100 becomes lower.

Furthermore, the finger parts 16b extending from the body 16a do not connect to each other. In this way, a gap is formed between two adjacent finger parts 16b; therefore, a part of the interface between the first III-V compound layer 12 and the second III-V compound layer 14 disposed between the body 16a and the drain electrode 20 is not covered by the finger parts 16b, and 2DEG 24 can be formed within the interface. Under this circumstance, when the HEMT 100 is turned on, 2DEG 24 can flow in the interface not covered by the finger parts 16b. On the contrary, if the interface between the first III-V compound layer 12 and the second III-V compound layer 14 is covered by a continuous third III-V compound layer, 2DEG 24 can not be formed at the interface. In this way, when the HEMT 100 is turned on, large voltage is needed in order to form a channel. In other words, an HEMT with a continuous third III-V compound layer covering between the body 16a and the drain electrode 20 has a higher Ron (on-state resistance) comparing to the HEMT 100 with finger parts 16b covering between the body 16a and the drain electrode 20.

Figure 3:
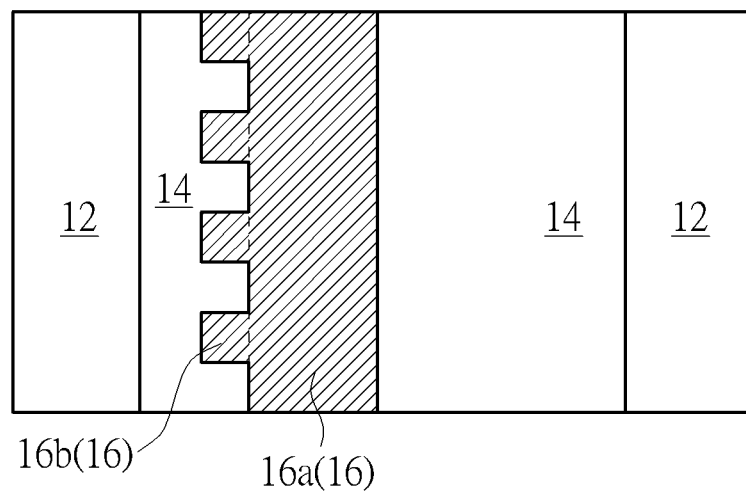
FIG. 3 depicts a top view of an HEMT according to a varied type of the first preferred embodiment of the present invention.
Figure 4:
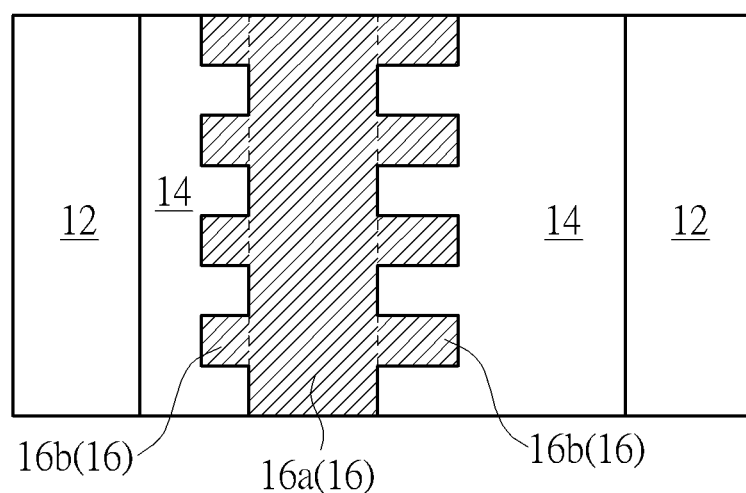
FIG. 4 depicts a top view of an HEMT according to another varied type of the first preferred embodiment of the present invention.

FIG. 3 depicts a top view of an HEMT according to a varied type of the first preferred embodiment of the present invention. FIG. 4 depicts a top view of an HEMT according to another varied type of the first preferred embodiment of the present invention. In order to show a third III-V compound layer clearly, a source electrode, a drain electrode and a gate electrode are omitted. Elements which are substantially the same as those in the first preferred embodiment are denoted by the same reference numerals; an accompanying explanation is therefore omitted.

As mentioned above, the third III-V compound layer 16 is formed by a body 16a and numerous finger parts 16b. FIG. 2 is exemplified by the finger parts 16b extending toward the drain electrode 20, which means that the finger parts 16b are only disposed between the body 16a and the drain electrode 20, but not limited to this. As shown in FIG. 3, the finger parts 16b extend toward the source electrode 18, and the finger parts 16b are only disposed between the body 16a and the source electrode 18. As shown in FIG. 4, the finger parts 16b extend toward drain electrode 20 and the source electrode 18.

Figure 5:
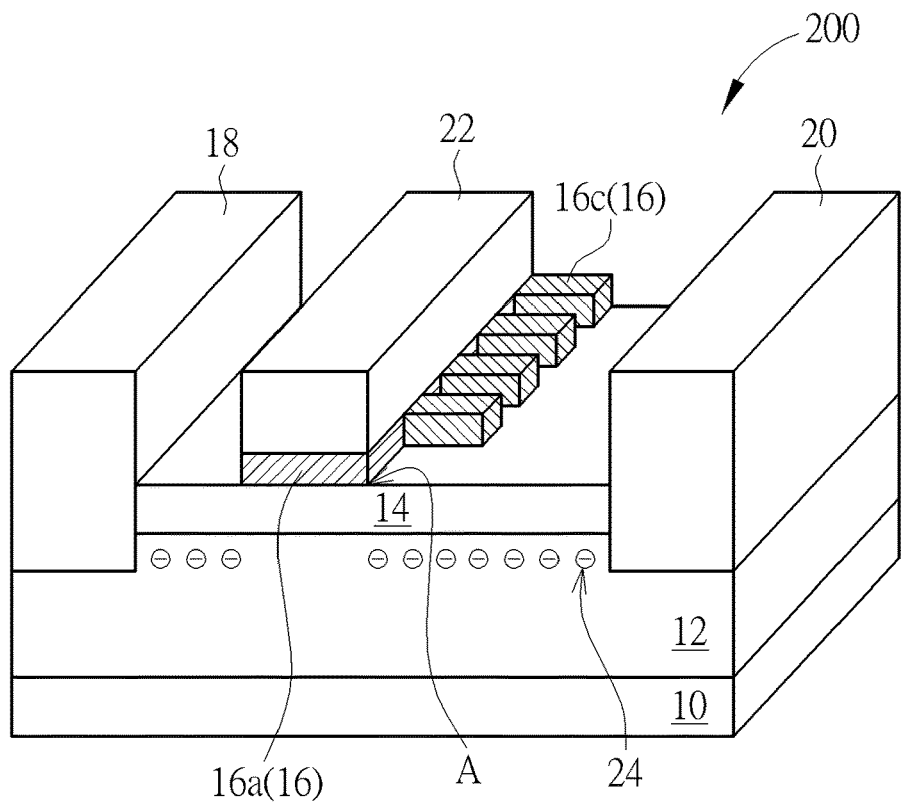
FIG. 5 depicts a three-dimensional view of an HEMT according to a second preferred embodiment of the present invention.
Figure 6:
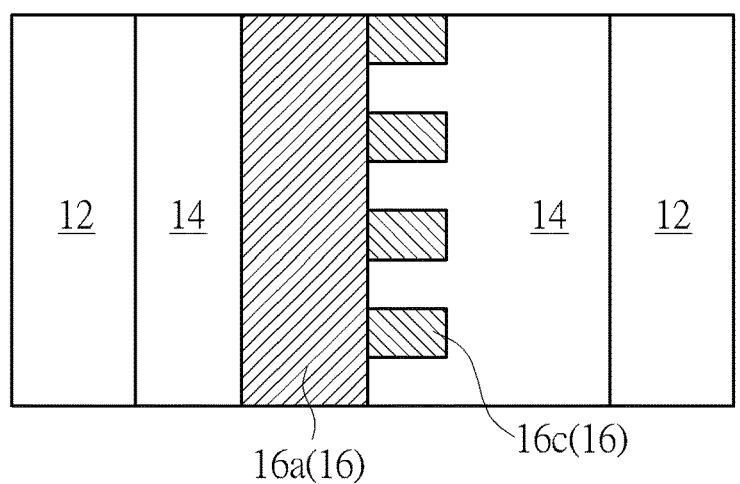
FIG. 6 depicts a top view of an HEMT according to a second preferred embodiment of the present invention.

FIG. 5 depicts a three-dimensional view of an HEMT according to a second preferred embodiment of the present invention. FIG. 6 depicts a top view of an HEMT according to a second preferred embodiment of the present invention, wherein in order to show a third III-V compound layer clearly, a source electrode, a drain electrode and a gate electrode are omitted. Elements which are substantially the same as those in the first preferred embodiment are denoted by the same reference numerals; an accompanying explanation is therefore omitted.

The difference between the first preferred embodiment and the and the second preferred embodiment is that the third III-V compound layer 16 in the second preferred embodiment is formed by a P-type III-V compound layer and an undoped III-V compound layer. More specifically speaking, the body 16a in the second preferred embodiment is formed by a P-type III-V compound layer, and the finger parts 16c in the second preferred embodiment is formed by an undoped III-V compound layer. Furthermore, the III-V compound layer in the body 16a and in the finger part 16c are composed of the same group III-V elements. For example, the body 16a can be a P-type gallium nitride, and the finger parts 16c can be an undoped gallium nitride. Moreover, there are no N-type dopants in the body 16a and the finger parts 16c. Other elements in the second preferred embodiment are the same as those in the first preferred embodiment, an accompanying explanation is therefore omitted. No matter the finger parts 16b/16c are formed by a P-type III-V compound layer or an undoped III-V compound layer, the HEMTs 100/200 have high withstand voltages and a low Ron. The difference between the HEMTs 100/200 is that when the finger parts 16b formed by a P-type III-V compound layer, 2DEG 24 of the HEMT 100 has higher current density, when the finger parts 16c formed by a undoped III-V compound layer, 2DEG 24 of the HEMT 200 has lower current density.

Figure 7:
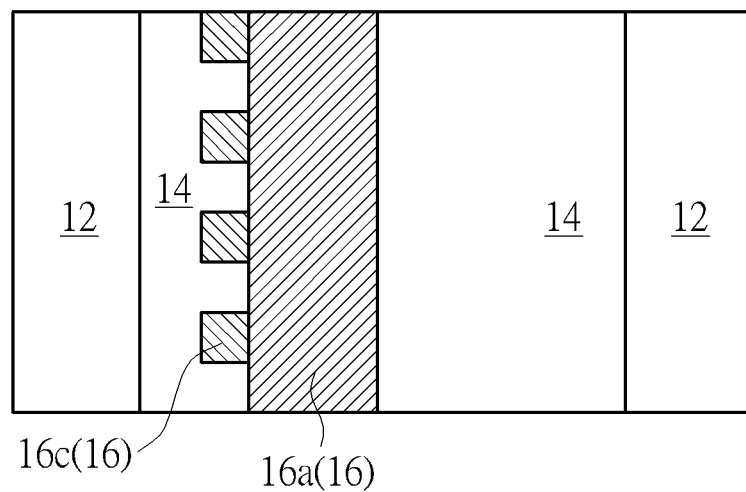
FIG. 7 depicts a top view of an HEMT according to a varied type of the second preferred embodiment of the present invention.
Figure 8:
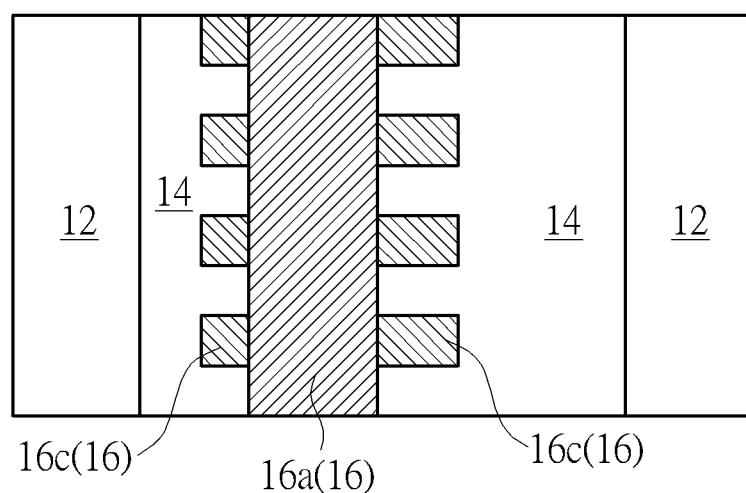
FIG. 8 depicts a top view of an HEMT according to another varied type of the second preferred embodiment of the present invention.

FIG. 7 depicts a top view of an HEMT according to a varied type of the second preferred embodiment of the present invention. FIG. 8 depicts a top view of an HEMT according to another varied type of the second preferred embodiment of the present invention. In order to show a third III-V compound layer clearly, a source electrode, a drain electrode and a gate electrode are omitted. Elements which are substantially the same as those in the first preferred embodiment are denoted by the same reference numerals; an accompanying explanation is therefore omitted.

FIG. 6 is exemplified by the finger parts 16c extending toward the drain electrode 20, which means that the finger parts 16c are only disposed between the body 16a and the drain electrode 20, but not limited to this. As shown in FIG. 7, the finger parts 16c extend toward the source electrode 18, and the finger parts 16c are only disposed between the body 16a and the source electrode 18. As shown in FIG. 8, the finger parts 16c extend toward drain electrode 20 and the source electrode 18.

Figure 9:
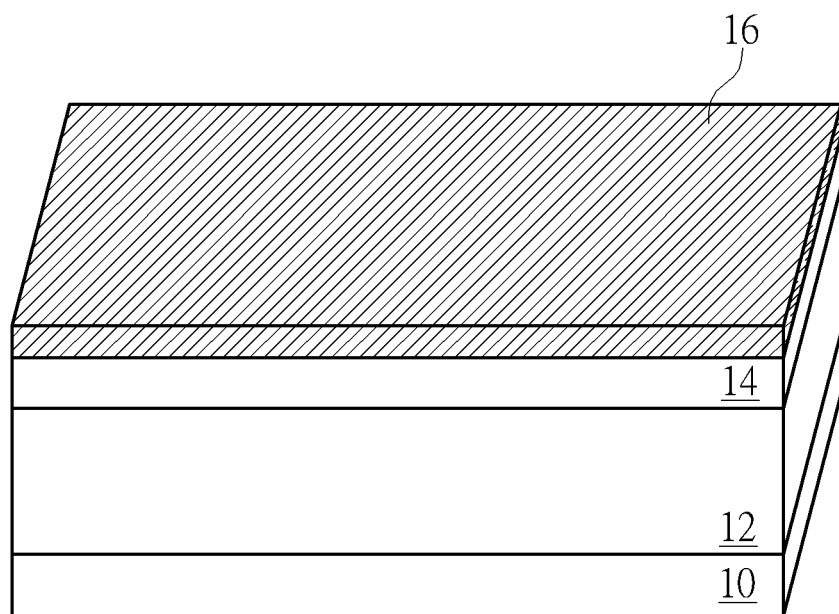
FIG. 9 and FIG. 10 depict a fabricating method of an HEMT with both a body and finger parts having P-type dopants.
Figure 10:
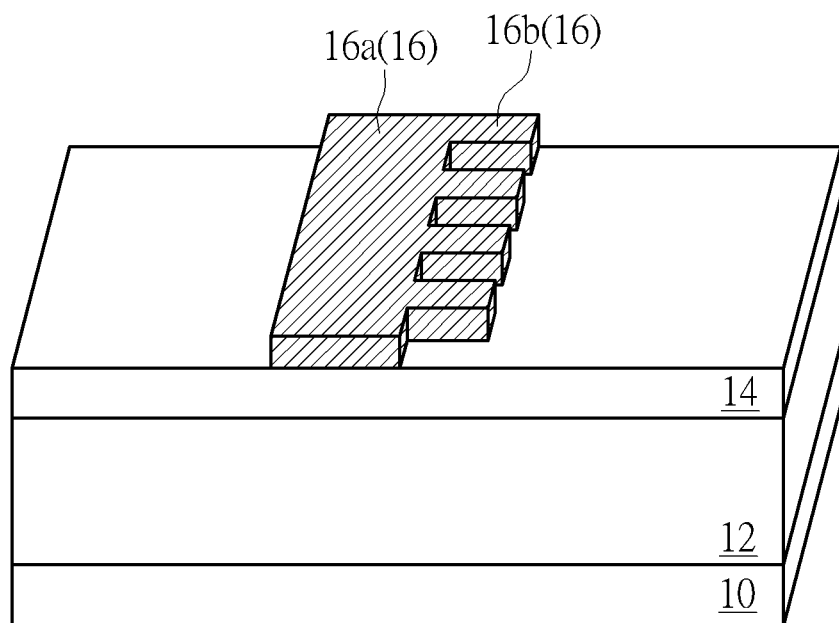
Figure 11:
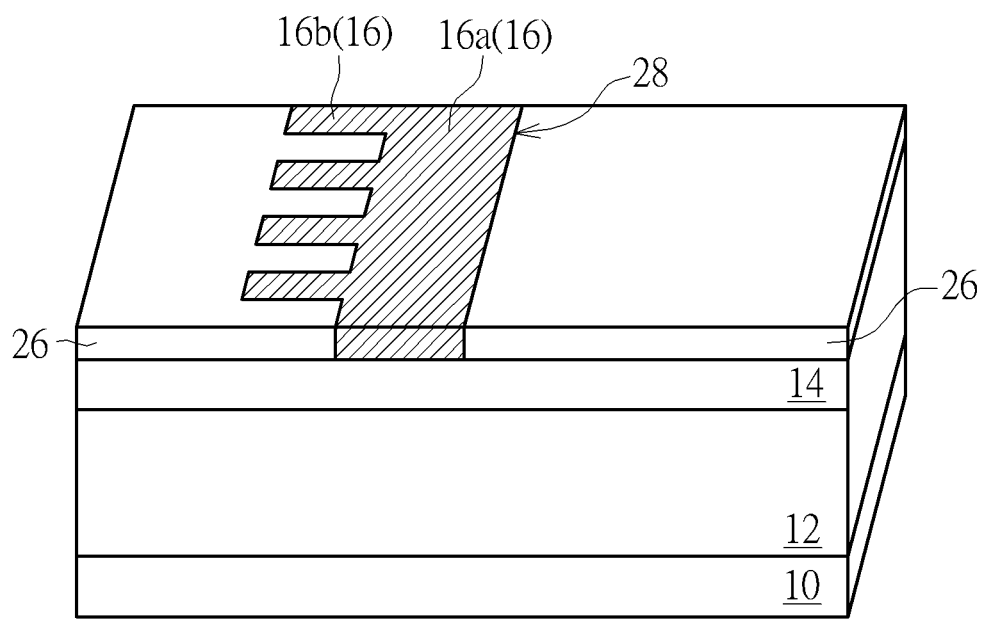
FIG. 11 and FIG. 12 depict another fabricating method of an HEMT with both a body and finger parts having P-type dopants.
Figure 12:
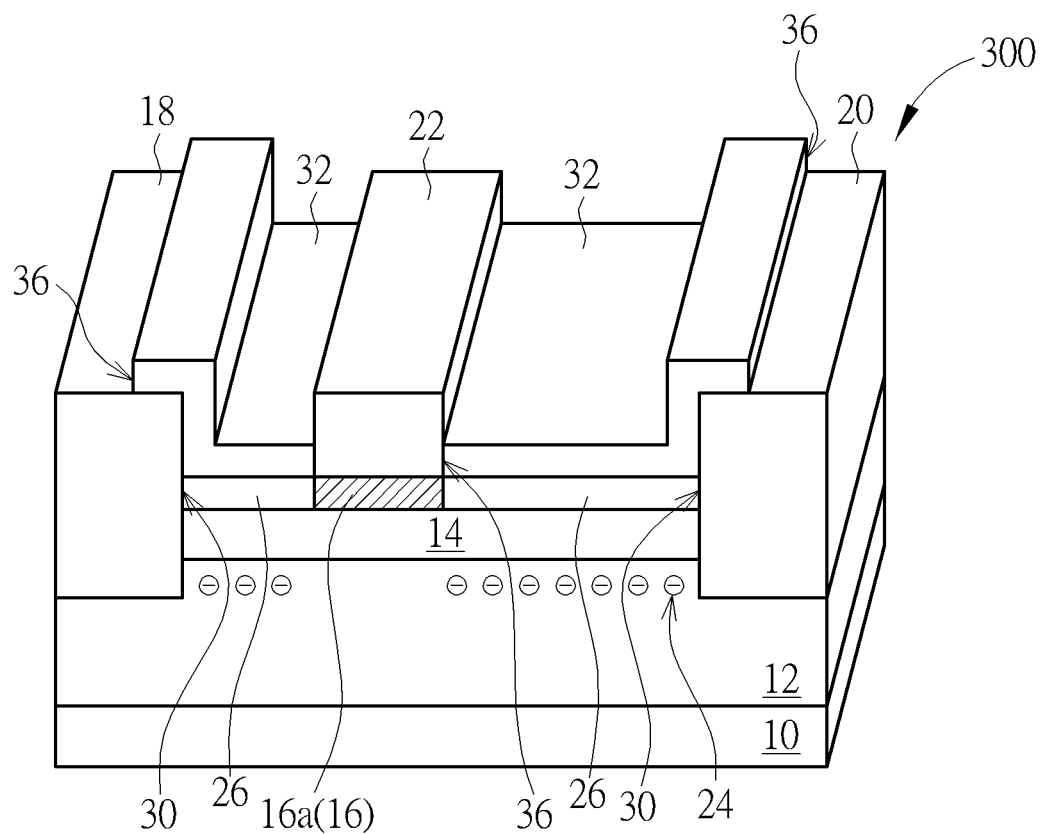

The following paragraphs illustrate numerous methods of fabricating the HEMT in the present invention, however, the fabricating methods of the HEMT in the present invention are not limited by those methods. Other suitable fabricating methods could be used in the present invention. FIG. 9 and FIG. 10 depict a fabricating method of an HEMT with both a body and finger parts having P-type dopants. FIG. 11 and FIG. 12 depict another fabricating method of an HEMT with both a body and finger parts having P-type dopants. Elements which are substantially the same as those in the first preferred embodiment are denoted by the same reference numerals; an accompanying explanation is therefore omitted.

As shown in FIG. 9, a substrate 10 is provided. Then, a first III-V compound layer 12 and a second III-V compound layer 14 are formed in sequence to cover the substrate 10. Later, a third III-V compound layer 16 is formed to be disposed on the second III-V compound layer. According to a preferred embodiment of the present invention, the first III-V compound layer 12 and the third III-V compound layer 16 are gallium nitride. But the first III-V compound layer 12 is undoped gallium nitride. The third III-V compound layer 16 is P-type gallium nitride. The second III-V compound layer 14 is undoped aluminum gallium nitride.

As shown in FIG. 10, a lithographic process is performed to pattern the third III-V compound layer 16 to form a body 16a and numerous finger parts 16b. The finger parts 16b extend from the body 16a. Next, as shown in FIG. 1, a source electrode 18 and a drain electrode 20 are formed simultaneously at two sides of the third III-V compound layer 16. The source electrode 18 and the drain electrode 20 contact the first III-V compound layer 12 and the second III-V compound layer 14. Next, a gate electrode 22 is formed to contact the body 16a. At this point, an HEMT 100 of the present invention is completed.

According to another fabricating method, as shown in FIG. 11, a substrate 10 is provided. Later, a first III-V compound layer 12 and a second III-V compound layer 14 are formed in sequence to cover the substrate 10. Then, a first protective layer 26 is formed to cover the second III-V compound layer 14. Subsequently, the first protective layer 26 is patterned to form a first opening 28 which defines predetermined positions of a third III-V compound layer 16. Next, a third III-V compound layer 16 is formed to fill up the first opening 28, and the third III-V compound layer 16 is framed by the first opening 28 to form the body 16a and finger parts 16b. As shown in FIG. 12, the first protective layer 26 is patterned again to form two second openings 30 exposing the first III-V compound layer 12. The two openings 30 define predetermined positions of a source electrode 18 and a drain electrode 20. Next, the source electrode 18 and the drain electrode 20 are formed to fill in each of the second openings 30. After that, a second protective layer 32 is formed to cover the first protective layer 26, the third III-V compound layer 16, the source electrode 18 and the drain electrode 20. Later, the second protective layer 32 is etched to form three third openings 36 within the second protective layer 32. The body 16a, the source electrode 18 and the drain 20 are exposed through the third openings 36. Later, the gate electrode 22 is formed to fill in one of the third openings 36 and the gate electrode 22 contacts the body 16a. The first protective layer 26 and the second protective layer 32 may be silicon nitride or aluminum nitride. Now, an HEMT 300 of the present invention is completed.

Figure 13:
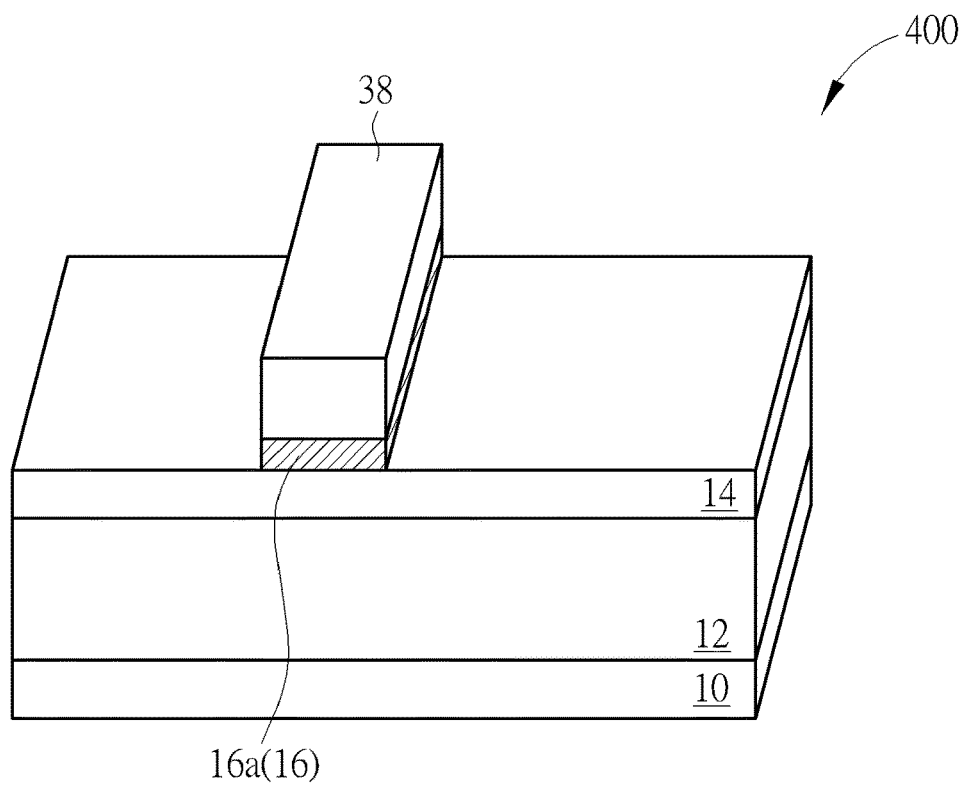
FIG. 13 and FIG. 14 depict a fabricating method of an HEMT with a body having P-type dopants and finger parts undoped according to a preferred embodiment of the present invention.
Figure 14:
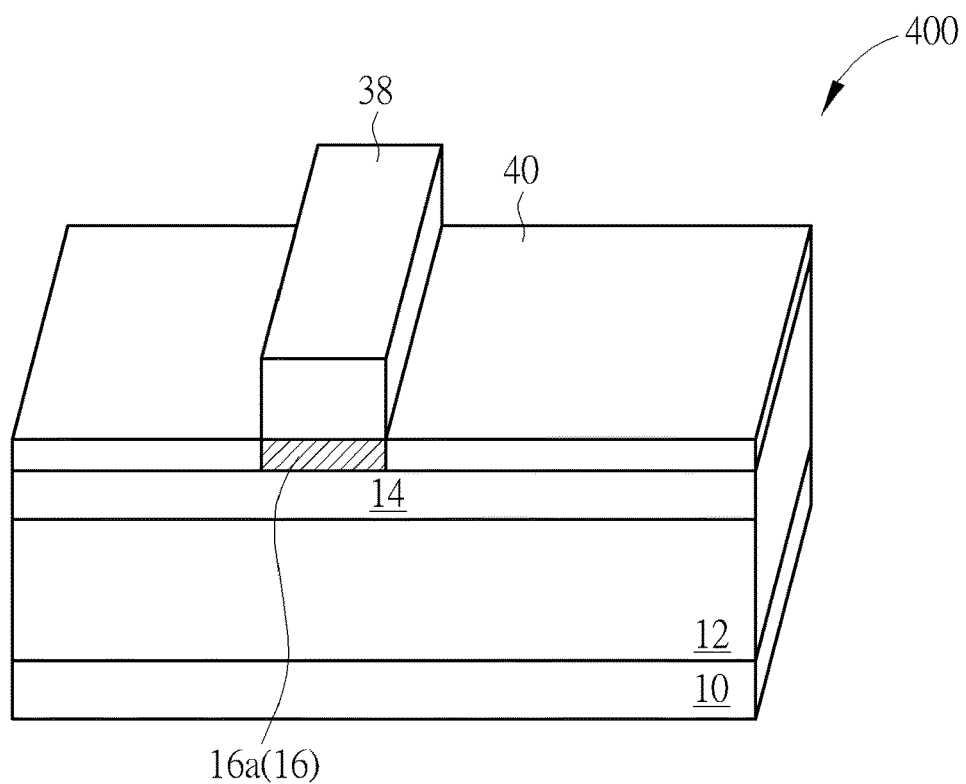
Figure 15:
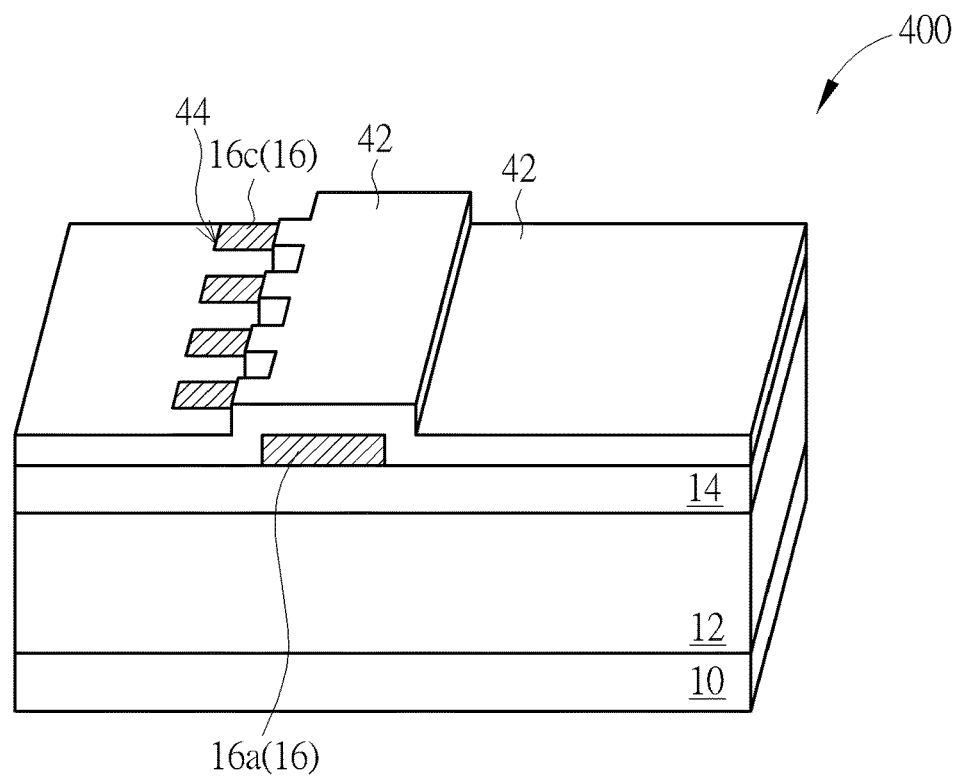
FIG. 15 and FIG. 16 depict a fabricating method of an HEMT with a body having P-type dopants and finger parts undoped according to another preferred embodiment of the present invention.
Figure 16:
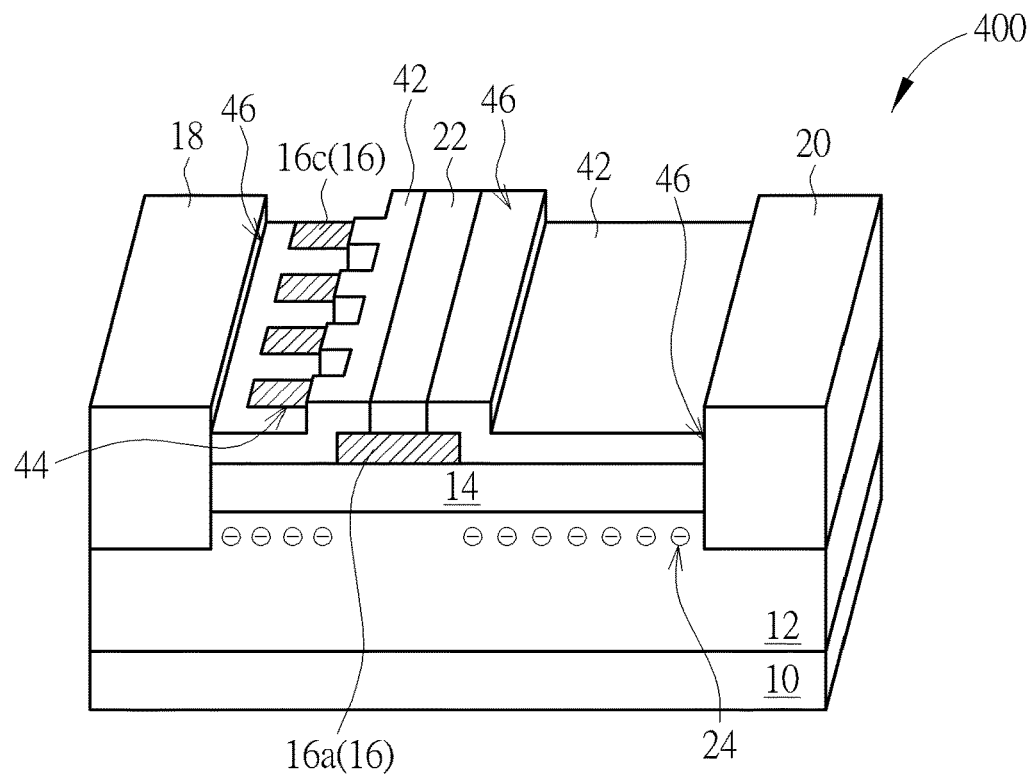

FIG. 13 and FIG. 14 depict a fabricating method of an HEMT with a body having P-type dopants and finger parts undoped according to a preferred embodiment of the present invention. FIG. 15 and FIG. 16 depict a fabricating method of an HEMT with a body having P-type dopants and finger parts undoped according to another preferred embodiment of the present invention. Elements which are substantially the same as those in the first preferred embodiment are denoted by the same reference numerals; an accompanying explanation is therefore omitted.

As shown in FIG. 13, a substrate 10 is provided. Later, a first III-V compound layer 12 and a second III-V compound layer 14 and a P-type III-V compound layer are formed in sequence to cover the substrate 10. According to a preferred embodiment of the present invention, the first III-V compound layer 12 is undoped gallium nitride. The P-type III-V compound layer is P-type gallium nitride. The second III-V compound layer 14 is undoped aluminum gallium nitride. Later, a mask layer 38 is formed to cover the P-type III-V compound layer. Next, the mask layer 38 is patterned. After that, the P-type gallium nitride is patterned to form a body 16a by taking the mask layer 38 as a mask. As shown in FIG. 14, an undoped III-V compound layer 40 is formed to cover the second III-V compound layer 14. As shown in FIG. 5, after removing the mask layer 38, the undoped III-V compound layer 40 is patterned to form numerous finger parts 16c. Now, the undoped III-V compound layer 40 and the P-type III-V compound layer form a third III-V compound layer 16. Next, a source electrode 18, a drain electrode 20 and a gate electrode 22 are formed. The source electrode 18 and the drain electrode 20 contact the first III-V compound layer 12. The gate electrode 22 contacts the body 16a.

According to another fabricating process in continuous from FIG. 13, after forming the body 16a, as shown in FIG. 15, the mask layer 38 is removed. Later, a protective layer 42 is formed to cover the body 16a and the second III-V compound layer 14. The protective layer 42 is patterned to form a first opening 44 which defines predetermined positions of numerous finger parts 16c. The second III-V compound layer 14 is exposed from the first opening 44. Next, an undoped III-V compound layer is formed to fill up the first opening 44 to form the finger parts 16c. As shown in FIG. 16, the protective layer 42 is patterned to form numerous second openings 46 respectively defining a predetermined position of a source electrode 18, a drain electrode 20 and a gate electrode 22. Subsequently, the source electrode 18, the drain electrode 20 and the gate electrode 22 are formed to fill in each of the second openings 46. The source electrode 18 and the drain electrode 20 contact the first III-V compound layer 12, and the gate electrode 22 contacts the body 16a. Now, an HEMT 400 of the present invention is completed.

The normally-off HEMT of the present invention has numerous finger parts extend from the body. In this way, the electric field of the interface between the first III-V compound layer and the second III-V compound layer covered by the finger parts become uniform, and a withstand voltage of the HEMT is increased.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A fabricating method of a high electron mobility transistor (HEMT), comprising:
   forming a first III-V compound layer and a second III-V compound layer, wherein the second III-V compound layer is disposed on the first III-V compound layer, and a composition of the first III-V compound layer is different from a composition of the second III-V compound layer;
   forming a third III-V compound layer disposed on the second III-V compound layer, wherein the third III-V compound layer comprises a body and a plurality of finger parts, each of the finger parts is connected to the body, all finger parts are parallel to each other; and
   forming a source electrode, a drain electrode and a gate electrode, wherein the source electrode is disposed at one side of the body, the drain electrode is disposed at another side of the body and the gate electrode is disposed directly on the body, wherein steps of forming the third III-V compound layer comprises:
   before forming the third III-V compound layer, forming a first protective layer covering the second III-V compound layer;
   patterning the first protective layer to form a first opening which defines predetermined positions of the body and the plurality of finger parts, wherein the second III-V compound layer is exposed form the first opening;
   forming a P-type III-V compound layer filling up the first opening to form the body and the plurality of finger parts;
   after forming the body and the plurality of finger parts, patterning the first protective layer to form two second openings which define predetermined positions of the source electrode and the drain electrode;
   forming the source electrode and the drain electrode to fill in each of the second openings, wherein the source electrode and the drain electrode contact the first III-V compound layer;
   forming a second protective layer covering the first protective layer, the body, the plurality of finger parts, the source electrode, and the drain electrode;
   patterning the second protective layer to form three third openings within the second protective layer, the third openings respectively defining a predetermined position of the gate electrode, exposing the source electrode and exposing the drain electrode; and
   forming the gate electrode to fill in one of the third openings and contact the body.

2. The fabricating method of the HEMT of claim 1, wherein the first III-V compound layer and the third III-V compound layer are gallium nitride, and the second III-V compound layer comprises aluminum gallium nitride, aluminum indium nitride, aluminum indium gallium nitride or aluminum indium.

3. The fabricating method of the HEMT of claim 1, wherein the plurality of finger parts are only disposed between the body and the drain electrode.

4. The fabricating method of the HEMT of claim 1, wherein the plurality of finger parts are only disposed between the body and the source electrode.

5. The fabricating method of the HEMT of claim 1, wherein the plurality of finger parts are disposed between the body and the drain electrode, and between the body and the source electrode.

6. The fabricating method of the HEMT of claim 1, wherein there is no N-type dopants within the plurality of finger parts.

7. The fabricating method of the HEMT of claim 1, wherein the plurality of finger parts extends along a direction which moves away from the body.

8. A fabricating method of a high electron mobility transistor (HEMT), comprising:
   forming a first III-V compound layer and a second III-V compound layer, wherein the second III-V compound layer is disposed on the first III-V compound layer, and a composition of the first III-V compound layer is different from a composition of the second III-V compound layer;
   forming a third III-V compound layer disposed on the second III-V compound layer, wherein the third III-V compound layer comprises a body and a plurality of finger parts, each of the finger parts is connected to the body, all finger parts are parallel to each other; and
   forming a source electrode, a drain electrode and a gate electrode, wherein the source electrode is disposed at one side of the body, the drain electrode is disposed at another side of the body and the gate electrode is disposed directly on the body, wherein steps of forming the third III-V compound layer comprises:
   forming a P-type III-V compound layer;
   patterning the P-type III-V compound layer to form the body;
   after forming the body, forming an undoped III-V compound layer covering the second III-V compound layer;
   patterning the undoped III-V compound layer to form the plurality of finger parts;
   after forming the body and the plurality of finger parts, forming a source electrode, a drain electrode and a gate electrode, wherein the source electrode and the drain electrode contact the first III-V compound layer, and the gate electrode contacts the body.

9. The fabricating method of the HEMT of claim 8, wherein the first III-V compound layer and the third III-V compound layer are gallium nitride, and the second III-V compound layer comprises aluminum gallium nitride, aluminum indium nitride, aluminum indium gallium nitride or aluminum indium.

10. The fabricating method of the HEMT of claim 8, wherein the plurality of finger parts are only disposed between the body and the drain electrode.

11. The fabricating method of the HEMT of claim 8, wherein the plurality of finger parts are only disposed between the body and the source electrode.

12. The fabricating method of the HEMT of claim 8, wherein the plurality of finger parts are disposed between the body and the drain electrode, and between the body and the source electrode.

13. The fabricating method of the HEMT of claim 8, wherein there is no N-type dopants within the plurality of finger parts.

14. A fabricating method of a high electron mobility transistor (HEMT), comprising:
   forming a first III-V compound layer and a second III-V compound layer, wherein the second III-V compound layer is disposed on the first III-V compound layer, and a composition of the first III-V compound layer is different from a composition of the second III-V compound layer;
   forming a third III-V compound layer disposed on the second III-V compound layer, wherein the third III-V compound layer comprises a body and a plurality of finger parts, each of the finger parts is connected to the body, all finger parts are parallel to each other; and
   forming a source electrode, a drain electrode and a gate electrode, wherein the source electrode is disposed at one side of the body, the drain electrode is disposed at another side of the body and the gate electrode is disposed directly on the body, wherein steps of forming the third III-V compound layer comprises:
   forming a P-type III-V compound layer;
   patterning the P-type III-V compound layer to form the body;
   forming a protective layer covering the body and the second III-V compound layer;
   patterning the first protective layer to form a first opening which defines predetermined positions of the plurality of finger parts, wherein the second III-V compound layer is exposed from the first opening;
   forming a undoped III-V compound layer filling up the first opening to form the plurality of finger parts;
   after forming the plurality of finger parts, patterning the protective layer to form a plurality of second openings respectively defining a predetermined position of the source electrode, the drain electrode and the gate electrode; and
   forming the source electrode, the drain electrode and the gate electrode to fill in each of the second openings, wherein the source electrode and the drain electrode contact the first III-V compound layer, and the gate electrode contacts the body.

15. The fabricating method of the HEMT of claim 14, wherein the first III-V compound layer and the third III-V compound layer are gallium nitride, and the second III-V compound layer comprises aluminum gallium nitride, aluminum indium nitride, aluminum indium gallium nitride or aluminum indium.

16. The fabricating method of the HEMT of claim 14, wherein the plurality of finger parts are only disposed between the body and the drain electrode.

17. The fabricating method of the HEMT of claim 14, wherein the plurality of finger parts are only disposed between the body and the source electrode.

18. The fabricating method of the HEMT of claim 14, wherein the plurality of finger parts are disposed between the body and the drain electrode, and between the body and the source electrode.

19. The fabricating method of the HEMT of claim 14, wherein there is no N-type dopants within the plurality of finger parts.

\* \* \* \* \*